Feb. 21, 1967 H. D. KAISER ET AL 3,305,394

METHOD OF MAKING A CAPACITOR WITH A MULTILAYERED FERROELECTRIC DIELECTRIC

Filed June 30, 1964 2 Sheets-Sheet 1

INVENTORS
HAROLD D. KAISER
ARTHUR H. MONES

BY [signature]

ATTORNEY

Feb. 21, 1967 H. D. KAISER ET AL 3,305,394
METHOD OF MAKING A CAPACITOR WITH A MULTILAYERED FERROELECTRIC DIELECTRIC
Filed June 30, 1964 2 Sheets-Sheet 2

Patented Feb. 21, 1967

3,305,394

METHOD OF MAKING A CAPACITOR WITH A MULTILAYERED FERROELECTRIC DIELECTRIC

Harold D. Kaiser and Arthur H. Mones, Poughkeepsie, N.Y., assignors to International Business Machines Corporation, New York, N.Y., a corporation of New York Filed June 30, 1964, Ser. No. 379,241
2 Claims. (Cl. 117—217)

This invention relates to an improved capacitance device as well as a method for making such a device and more particularly to an improved capacitance device employing a ferroelectric type composition, the dielectric constant of which is relatively independent of its operating temperature.

In the development of microelectronic circuitry such as might be employed in digital computers and other electronic devices, a desired size reduction of the various electronic components is often limited by the electrical values and characteristics required of the respective components according to particular circuit designs. In this sense, improved circuit design often is achieved only as a result of improvements in the components used in that circuit. In the case of capacitors, reduction in the dimensions of a capacitor is normally achieved by the employment of dielectric materials having increased dielectric constants.

A particular class of materials that has been investigated in recent years for employment as a dielectric material for microelectronic capacitors is the class of ferroelectric materials. Such materials have relatively high dielectric constants, particularly in the neighborhood of their ferroelectric Curie temperature. However, the dielectric constant of such a material is highly temperature dependent and normally decreases rapidly as the temperature is varied away from the Curie temperature. It will be appreciated that temperature independent components are desirable in electronic circuits. Otherwise, such circuits must be provided with a controlled atmosphere to insure consistent operation. This latter alternative places extreme burden upon the design of electronic equipment and particularly digital computers where the trend is toward the minimization of the equipment size.

Ferroelectric materials may be described generally as a dielectric material, the crystal structure of which has an absence of a center of symmetry and which material is characterized by a hysteresis effect when the material is placed in an alternating electric field. The ferroelectric Curie temperature of the material is that temperature at which the material undergoes a transition and loses its ferroelectric characteristics as the temperature is increased thereabove. A particular group of ferroelectric materials that have been extensively employed as dielectic materials is the group of the so-called perovskites. This group is characterized by the general chemical formula $ABO_3$, A being di- or monovalent metal and B being a tetra- or pentavalent metal. Of this group of ferroelectrics, the most widely employed material is barium titanate ($BaTiO_3$) which has three transition temperatures which are respectively 120° C., 5° C. and −80° C. The highest of these transition temperatures is the so-called ferroelectric Curie temperature above which barium titanate is nonferroelectric and is characterized by a cubic crystal structure. In the temperature range between 50° C. and 120° C., the crystal structure is tetragonal, the crystal structure being orthorhombic in the temperature range between −80° C. and 5° C. and, below −80° C., the crystal structure is rhomohedral. In the neighborhood of each of the transition temperatures, the dielectric constant of barium titanate is increased and ranges from 4,000 at the lowest transition temperature to 10,000 at the Curie temperature for single crystals. However, between the respective transition temperatures, the dielectric constant drops considerably.

It is not desirable to operate a microelectronic circuit in the neighborhood of 5° C. or 120° C. or to provide systems to maintain components and circuitry at these respective temperatures.

It is generally well known that the transition temperatures, and in particular the Curie temperature of barium titanate, can be lowered by the addition of other materials to the crystal lattice. For example, the addition of strontium titanate ($SrTiO_3$) can have the effect of lowering the Curie temperature to as much as 0° C. for an addition of approximately 33 percent strontium titanate. In this manner, particular compositions can be obtained which have a Curie temperature and thus a high dielectric constant at or near room temperature. However, because of the very nature of the ferroelectric material in the neighborhood of its Curie temperature, the dielectric constant is still highly temperature dependent and components employing such a composition still must be operated in a controlled temperature atmosphere.

It is then an object of the present invention to provide a unique and improved composition having a high dielectric constant that is relatively temperature independent.

It is another object of the present invention to provide a capacitance device for microelectronic circuitry employing a unique dielectric material having a high dielectric constant that is relatively temperature independent.

It is still another object of the present invention to provide an improved method for the fabrication of a unique dielectric material having a high dielectric constant that is relatively temperature independent.

As stated above, the addition of strontium titanate to a sintered barium titanate serves to lower the Curie emperature of the composite structure to a degree depending upon the amount of strontium titanate that is added thereto. It is also known to those skilled in the art that the addition of either lead titanate ($PbTiO_3$) or lead zirconate ($PbZrO_3$) can serve to increase the Curie temperature of the barium titanate composition. In any event, a sintered mixture of the respective combinations of materials is characterized by a particular Curie temperature as though the combination were a single homogeneous composition with the result that the dielectric constant or permittivity is still highly temperature dependent, particularly in the neighborhood of the Curie temperature.

To achieve the objects of the present invention, it has been discovered that a composition having a relatively temperature independent permittivity or dielectric constant and more particularly having a dielectric constant, the temperature dependence of which can be controlled, can be obtained for a composite structure of two or more distinct and identifiable ferroelectric materials, the identities of which are maintained during the fabrication process. Such a composition is not characterized by a single Curie temperature at which the dielectric constant is at a maximum point but rather it is characterized by a dielectric constant that can be described as being approximately proportional to the weighted product of the dielectric constants of the individual distinct materials. Thus, if it is required to increase the dielectric constant of the composition for a particular operating temperature range, one can fulfill this requirement by adding an appropriate amount of a ferroelectric material having an optimum dielectric constant in that temperature range.

In the copending application of H. D. Kaiser, filed May 27, 1964, Serial No. 370,586, which application is assigned to the same assignee as the present application, there is disclosed a capacitance device employing a dielectric material formed of the combination of two or more ferroelectric materials to achieve objects similar to those of the present invention. However, in that application the respective ferroelectric materials are in powdered form and are kept separate from one another by suspension in and dispersement throughout a glassy binder material. The resultant dielectric material is characterized by a relatively temperature independent dielectric constant. However, in order to maintain separation of the respective ferroelectric materials so as to achieve this temperature independence, it is necessary to employ a sufficient amount of the glassy binder material to constitute at least 15 percent of the dielectric composition by volume. Since most glassy materials have a dielectric constant of no more than 50–100, it will be appreciated that employment of such a material tends to lower an otherwise high dielectric constant or permittivity of the composite dielectric structure.

In the present invention, the need for an appropriate binder material to maintain the different ferroelectric particles separate from one another is eliminated by the particular structure of the present invention wherein the dielectric composition is formed of layers, one upon another, of the different respective ferroelectric materials. In order to secure the respective layers together, each layer is screened and fired at a high temperature for a short period of time before the screening of the next layer to achieve a sintering between the interfaces of the respective layers as well as a sintering of the material in the respective layers without allowing diffusion of the material of one layer throughout the material of adjacent layers. In this manner, a dielectric composition is obtained, which composition includes a plurality of two or more distinct ferroelectric materials characterized by different Curie temperatures without the necessity of employing a binder material and without the disadvantageous characteristics of such a binder material, namely the reduction of the dielectric constant of the entire composition. The resultant dielectric composition is a distinct improvement over that disclosed in the above referred to copending application in that such a composition is characterized by a relatively temperature independent dielectric constant or permittivity which may be of the order of twice that obtained from the composition of the said copending application.

While the present invention may employ any two or more ferroelectric materials having different Curie temperatures, particular preferred compositions include sintered mixtures of barium titanate and strontium titanate of various percentages when it is desired to enhance the dielectric constant in the neighborhood of room temperature and sintered mixtures of barium titanate and a composition selected from the group of lead titanate and lead zirconate when it is desired to enhance the dielectric constant at temperatures well above room temperature. Corresponding carbonates and oxides may also be readily employed.

A feature, then, by which the objects of the present invention are achieved, resides in a dielectric structure of two or more ferroelectric materials having different Curie temperatures which ferroelectric materials are deposited in layers so as to be identifiable from one another.

Specifically, a feature of the present invention resides in a dielectric composition including a plurality of sintered mixtures of barium titanate and a material selected from the group of strontium titanate, lead titanate and lead zirconate, which mixtures are deposited in layers so as to be identifiable from one another.

Even more specifically, a feature of the present invention resides in a dielectric composition of a plurality of barium-strontium titanates having different Curie temperatures which materials are deposited in layers so as to be identifiable from one another.

Other objects, advantages and features of the present invention will become readily apparent from a review of the following specification when taken in conjunction with the drawings wherein.

Figure 1:
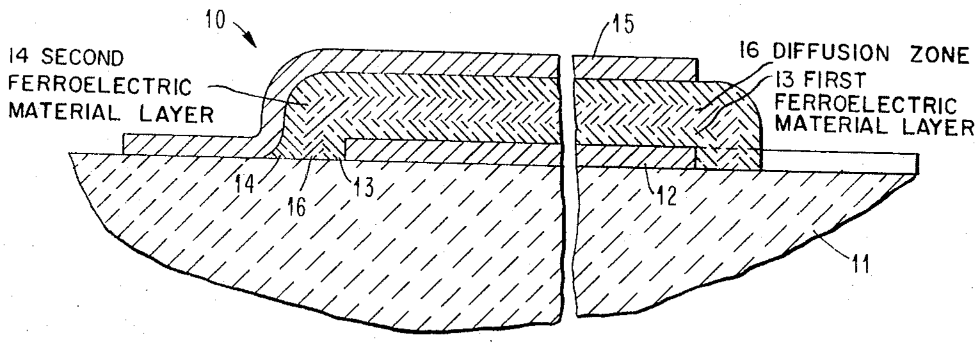
FIGURE 1 is a cross section of a capacitance device employing a dielectric material of the present invention.

To better describe the structure of the present invention, reference is now made to FIGURE 1 wherein capacitor 10 is formed by the deposition of first electrode 12 upon a modular substrate 11 after which respective layers of different ferroelectric materials such as layers 13 and 14 are deposited in consecutive order by conventional silk screening techniques. The number of layers employed, or more specifically the number of different ferroelectric materials employed, will be dependent upon the desired end result as will be more fully described below. To complete the structure, second electrode 15 is deposited on the dielectric material in accordance with standard electrode techniques. In fabricating the structure, it is preferable to fire each layer of the dielectric material in accordance with the procedure to be more fully described below in order to decrease the diffusion of the material in one layer into the material of adjacent layers. Even with this precaution, a certain amount of diffusion will occur as indicated by the cross sectional area 16.

Figure 2:
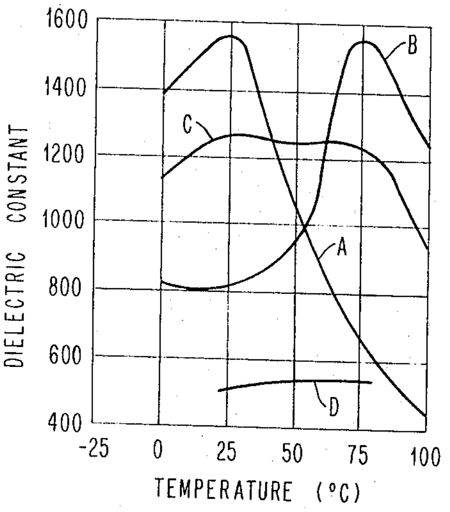
FIGURE 2 is a series of curves representing the dielectric constant or permittivity versus temperature for various dielectric structures in accordance with the present invention.

FIGURE 2 illustrates the temperature dependency of the dielectric constant or permittivity for the composite structure as described above as well as the temperature dependency of the individual layers of the respective dielectric materials employed therein. Curve A of FIGURE 2 represents the dielectric constant as a function of temperature of a barium titanate-strontium titanate system which contains 74 percent by weight of barium titanate and curve B represents a similar system containing 88 percent barium titanate by weight. It is observed that both particular systems are highly temperature dependent with the material of curve A having an optimum permittivity at its Curie point at approximately 25° C. while the material of curve B has its optimum permittivity at its Curie point at 75° C. When these two titanate systems are employed in distinct layers such as is illustrated in FIGURE 1, the permittivity of the composite structure is that illustrated by curve C of FIGURE 2 which is approximately temperature independent in the range of from 25° C. to 75° C. While this composite dielectric constant begins to decline as the operating temperature of the capacitor employing such a structure is decreased below 25° C. or above 75° C., such decline can be corrected by the employment of a third ferroelectric material having a Curie temperature in the particular temperature range where it is desired to enhance the composite dielectric constant. The form of curve C can also be varied by changing the amounts of the respective barium titanate-strontium titanate systems employed. In this sense it should be pointed out that curve C represents a composite dielectric constant for structure employing equal amounts of the 74 percent barium titanate system and 88 percent barium titanate system, as will be more fully explained in the below description of the method of fabrication of the structure of FIGURE 1.

Figure 4:
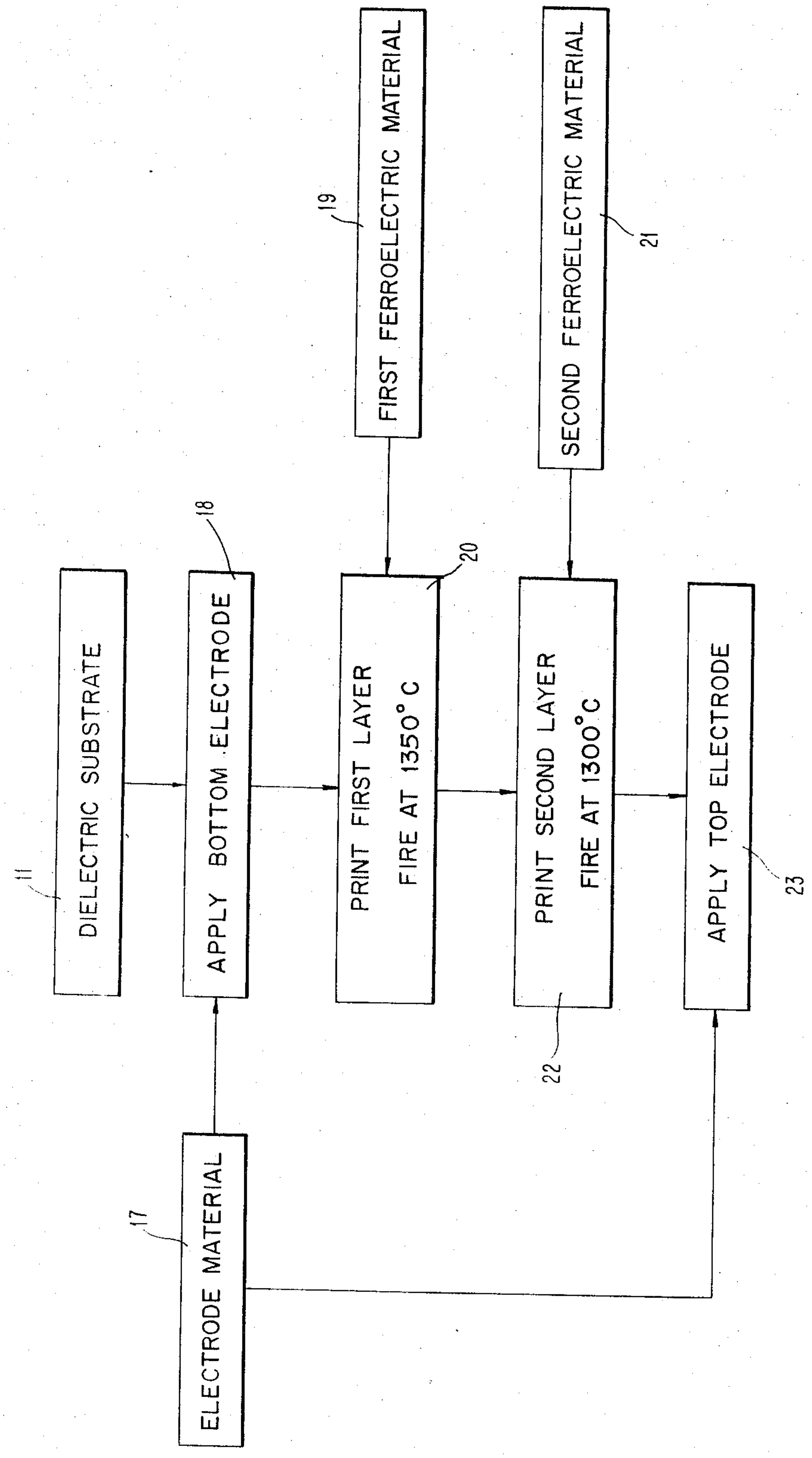
FIGURE 4 is a flow diagram of the materials used and of the operations performed in fabricating a microelectronic capacitor.

In order to fabricate a device according to the present invention such as illustrated in FIGURE 1 wherein the respective layers of the different ferroelectric materials are maintained relatively distinct from one another, reference will now be had to the flow diagram of FIGURE 4 wherein electrode material 17 forming first electrode 12 is deposited upon the modular substrate 11 by conventional electrode screening techniques after which layer 13 of the first ferroelectric material 19 is silk screened thereon and the resultant structure is fired at a temperature of about 1350° C. for approximately 10 minutes (step 20). This firing serves the purpose of sintering together the particles of this first ferroelectric material and to drive off the squeegee medium employed in the silk screening process. After the firing process for the first layer is completed, the second layer of a different ferroelectric material 21 is silk screened over the first layer and fired at approximately 1300° C. for about ten minutes (step 22). During the second firing, there will be a certain amount of diffusion of the particles of the material that go to make up the second layer across the interface and into the previously sintered first layer and, thus, the boundary between the respective layers will be in the form of a zone such as are 16 in FIGURE 1 which will have a characteristic of a sintered ferroelectric material distinct from that of the materials of the respective first and second layers. It is for the purpose of reducing zone 16 that the second layer of ferroelectric material is fired at a slightly lower temperature than was the first layer although both layers are fired within the sintering temperature range for barium titanate systems. It is also for this purpose that the respective firings are carried out for only approximately ten minutes while for a standard barium titanate system, the firing would be continued for a time period of as much as one hour. After the composite dielectric material has been thus formed, second electrode 15 is applied by conventional electrode techniques (step 23). The resulting thicknesses of the respective layers of the different ferroelectric materials has been the same in the process described above. However if it is desired to increase the amount of one of the ferroelectric materials as described above, this can be accomplished by increasing the thickness of the layer of that particular material.

Figure 3:
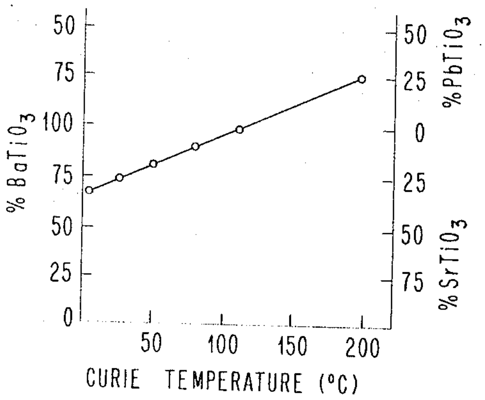
FIGURE 3 is a plot of temperature of maximum permittivity for a barium titanate system having different percentages of strontium titanate and lead titanate.

It has been found that if the respective ferroelectric material layers are fired for a period of one hour or if the two layers are consecutively screened and fired together, then, there results a relatively thorough diffusion of the one material throughout the other with the resulting composition having the characteristics of a singular sintered barium titanate system including a Curie point and a highly temperature dependent dielectric constant or permittivity which has an optimum at that Curie point. The variation of the Curie temperature of a particular barium titanate system by varying the percentage of barium titanate will be more fully described below with reference to FIGURE 3.

The specific electrode materials employed are not particularly critical and may be platinum, palladium, rhodium or any combination of noble metals, which will withstand the required temperatures.

It will be appreciated that the above described procedure can be used for fabrication of any dielectric material including the combination of two or more barium-strontium titanate systems. It is believed that if other ferroelectric materials are desired to be employed in place of particular barium-strontium titanate systems, one skilled in the art will be able to make appropriate adjustment in the above described procedure to achieve this end.

While it is known that the addition of strontium titanate to barium titanate will form a composite body having a Curie point lower than that of pure barium titanate, other compositions having similar crystal structures may be added to barium titanate to achieve an increased Curie point when such is desired. Particular materials that may be used toward this end include lead titanate and lead zirconate. To show the effect of the addition of such a material to barium titanate in relation to the effect of adding strontium titanate to barium titanate, reference is now made to FIGURE 3 which is a plot of the temperature at which optimum permittivity or the dielectric constant is achieved (i.e. Curie temperature) for various percentages of strontium titanate and lead titanate being added to the sintered barium titanate. It is observed in FIGURE 3 that an increase in the amount of strontium titanate added to the barium titanate lowers the Curie temperature in an approximately linear manner while the addition of lead titanate to the barium titanate increases the Curie temperature of the system in almost the same linear manner.

It should be emphasized that when one particular ferroelectric material is added to another to achieve a sintered composition having a specific Curie point, the two materials should have similar crystal lattice structures, which is the case for the various materials discussed above, and be members of the so-called perovskite group. However, the present invention is directed toward a composition comprising any two or more ferroelectric material systems, the identities of which are maintained in the composition and each of which has a different Curie temperature. In this sense it is not required that the two particular ferroelectric material systems should have the same or similar crystal lattice structures.

While the present structure and method for preparing the structure results in the composite material having layers of distinct, identifiable ferroelectric materials having different temperature points such that the composite dielectric constant may be described as the weighted product of the dielectric constants of the individual materials, this "balanced Curie point" system is disclosed in the above referred to copending application. However, in that application the respective distinct materials are maintained separate from one another by dispersion throughout a glass binder material. Such glass binder materials have relatively low dielectric constants which decrease the dielectric constant of the composite structure. In this sense, the present structure and method serve to enhance the composite dielectric constant by as much of a factor of two. For example, the composite dielectric constant of the structure of FIGURE 1 is relatively temperature independent to the range of from 25° C. to 75° C. and is of the order of 1250 as indicated by curve C in FIGURE 2, while employment of the same materials in particle form suspended throughout a glass binder such as disclosed in the above referred to pending application results in a composite dielectric constant of approximately 550 as indicated by curve D in FIGURE 2.

While the present invention has been particularly shown and described with reference to preferred embodiments of specific compositions, it will be understood by those skilled in the art that changes and modifications in form and details may be made without departing form the spirit and scope of the present invention.

What is claimed is:

1. A method of forming a composite dielectric structure which includes the steps of:

preparing first ferroelectric material particles having a high distinct temperature dependent dielectric constant;

firing said first dielectric material particles to sinter them together and form a first, distinct layer of said first ferroelectric material;

preparing second ferroelectric material particles having a high, distinct temperature dependent dielectric constant which differs from that of said first ferroelectric material particles;

depositing said second ferroelectric material particles on said first, distinct layer; and firing said second ferroelectric material particles at a temperature and for a period of time long enough for sintering said second ferroelectric material particles together to form a second, distinct layer of said second ferroelectric material, and for achieving a sintering between the interfaces of the respective layers without diffusion of the material of either layer throughout the material of the other layer thereby forming an integral composite dielectric structure of discrete layers, said structure having a dielectric constant with values which are approximately proportional to the weighted product of the dielectric constants of the respective layers over a portion of its operating range.

2. A method of forming a microelectronic capacitor device on a dielectric substrate which includes the steps of:

depositing a first electrode material on the substrate and forming a first capacitor electrode;

depositing first ferroelectric material particles having a high, distinct temperature dependent dielectric constant on said first capacitor electrode;

firing said first dielectric material particles to sinter them together and form a first, distinct layer of said first ferroelectric material;

depositing second ferroelectric material particles having a high distinct temperature dependent dielectric constant which differs from that of said first ferroelectric material particles on said first, distinct layer;

firing said second ferroelectric materials together at a temperature and for a period of time long enough for sintering said second ferroelectric material particles together to form a second, distinct layer of said tering between the interfaces of the respective layers second ferroelectric material, and for achieving a sintering between the interfaces of the respective layers without diffusion of the material of either layer throughout the materials of the other layer; and depositing a second electrode material on said second distinct layer and forming a second capacitor electrode.

References Cited by the Examiner

UNITED STATES PATENTS

| | | | |
|---|---|---|---|
| 2,673,949 | 3/1954 | Khouri | 317—258 X |
| 2,759,854 | 8/1956 | Kilby | 317—258 X |
| 2,842,726 | 7/1958 | Robinson | 317—258 |
| 3,210,607 | 10/1965 | Flanagan | 317—258 X |

FOREIGN PATENTS

| | | |
|---|---|---|
| 601,220 | 4/1948 | Great Britain. |

OTHER REFERENCES

Birks, J. B.: Modern Dielectric Materials, London, Heywood & Co., 1960, pp. 182–187.

LEWIS H. MYERS, *Primary Examiner.*

J. F. BURNS, *Examiner.*

E. GOLDBERG, *Assistant Examiner.*